(12) United States Patent
Yakushiji et al.

(10) Patent No.: US 11,600,295 B2
(45) Date of Patent: Mar. 7, 2023

(54) VACUUM PROCESS APPARATUS AND VACUUM PROCESS METHOD

(71) Applicant: CANON ANELVA CORPORATION, Kawasaki (JP)

(72) Inventors: Hiroshi Yakushiji, Tokyo (JP); Masahiro Shibamoto, Hachioji (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 15/131,084

(22) Filed: Apr. 18, 2016

(65) Prior Publication Data

US 2016/0232932 A1  Aug. 11, 2016

Related U.S. Application Data

(63) Continuation of application No. PCT/JP2014/005862, filed on Nov. 21, 2014.

(30) Foreign Application Priority Data

Mar. 4, 2014 (JP) .............................. JP2014-041685

(51) Int. Cl.
*C23C 14/56* (2006.01)
*C23C 14/58* (2006.01)
(Continued)

(52) U.S. Cl.
CPC ........ *G11B 5/8408* (2013.01); *C23C 14/0605* (2013.01); *C23C 14/24* (2013.01);
(Continued)

(58) Field of Classification Search
None
See application file for complete search history.

(56) References Cited

U.S. PATENT DOCUMENTS 4,889,767 A * 12/1989 Yokoyama ............... G11B 5/72
428/336
5,540,957 A * 7/1996 Ueda ....................... G11B 5/72
427/131
(Continued)

FOREIGN PATENT DOCUMENTS

JP 62159433 A * 7/1987
JP 8-274142 A 10/1996
(Continued)

OTHER PUBLICATIONS

International Search Report (PCT/ISA/210) dated Feb. 24, 2015, by the Japanese Patent Office as the International Searching Authority for International Application No. PCT/JP2014/005862.
(Continued)

*Primary Examiner* — Karla A Moore
(74) *Attorney, Agent, or Firm* — Buchanan Ingersoll & Rooney PC

(57) ABSTRACT

A vacuum process method for a magnetic recording medium having a surface protective layer for protecting a magnetic recording layer formed on a substrate includes a ta-C film forming step of forming a ta-C film on the magnetic recording layer, a transportation step of transporting a substrate on which the ta-C film is formed, a radical generation step of generating radicals by exciting a process gas, and a radical process step of irradiating a surface of the ta-C film with the radicals.

4 Claims, 7 Drawing Sheets

(51) Int. Cl.
  *H01J 37/32* (2006.01)
  *G11B 5/84* (2006.01)
  *C23C 14/32* (2006.01)
  *C23C 14/06* (2006.01)
  *C23C 14/24* (2006.01)

(52) U.S. Cl.
  CPC .......... *C23C 14/325* (2013.01); *C23C 14/566* (2013.01); *C23C 14/568* (2013.01); *C23C 14/5846* (2013.01); *H01J 37/32357* (2013.01)

(56) References Cited

U.S. PATENT DOCUMENTS

| | | | |
|---|---|---|---|
| 5,846,328 | A | 12/1998 | Aruga et al. |
| 6,027,618 | A | 2/2000 | Aruga et al. |
| 6,031,239 | A * | 2/2000 | Shi ........................ C23C 14/221 |
| | | | 250/396 ML |
| 6,077,355 | A * | 6/2000 | Yamashita .......... C23C 16/4482 |
| | | | 118/708 |
| 6,251,232 | B1 * | 6/2001 | Aruga .................... C23C 14/50 |
| | | | 118/503 |
| 6,528,395 | B2 | 3/2003 | Nakamura |
| 6,815,316 | B2 | 11/2004 | Nakamura |
| 7,780,790 | B2 | 8/2010 | Nogami |
| 7,805,827 | B2 | 10/2010 | Yasui et al. |
| 8,293,016 | B2 * | 10/2012 | Bahng ............... H01L 21/68785 |
| | | | 118/725 |
| 8,900,465 | B1 * | 12/2014 | Yun ...................... G11B 5/8408 |
| | | | 216/22 |
| 2002/0028358 | A1 | 3/2002 | Ishibashi et al. |
| 2002/0114880 | A1 * | 8/2002 | Dreistein ............... C23C 14/022 |
| | | | 427/8 |
| 2003/0028358 | A1 * | 2/2003 | Niu ........................ G01B 11/24 |
| | | | 703/2 |
| 2003/0185986 | A1 * | 10/2003 | Ma .......................... C23C 14/12 |
| | | | 427/282 |
| 2004/0154743 | A1 * | 8/2004 | Savas ..................... G03F 7/427 |
| | | | 156/345.5 |
| 2005/0115830 | A1 * | 6/2005 | Furukawa ............. C23C 14/568 |
| | | | 204/298.25 |
| 2005/0257744 | A1 * | 11/2005 | Boardman ............ C23C 14/046 |
| | | | 118/723 MW |
| 2007/0113868 | A1 * | 5/2007 | Fu ..................... H01J 37/32357 |
| | | | 134/1.2 |
| 2009/0056878 | A1 * | 3/2009 | Nozawa ............ H01L 21/68707 |
| | | | 156/345.54 |
| 2009/0135521 | A1 * | 5/2009 | Ueda .................... G11B 5/3106 |
| | | | 360/235.4 |
| 2009/0291326 | A1 | 11/2009 | Nagata |
| 2010/0018945 | A1 * | 1/2010 | Guo ..................... G11B 5/8408 |
| | | | 216/22 |
| 2010/0130017 | A1 * | 5/2010 | Luo ...................... H01J 37/3244 |
| | | | 156/345.35 |
| 2011/0081503 | A1 * | 4/2011 | Zhao ................... H01L 21/0212 |
| | | | 427/577 |
| 2012/0145079 | A1 * | 6/2012 | Lubomirsky ..... H01L 21/67109 |
| | | | 118/719 |
| 2012/0223048 | A1 * | 9/2012 | Paranjpe ............... C23C 14/505 |
| | | | 216/22 |
| 2013/0143348 | A1 * | 6/2013 | Ota ........................ H01L 21/223 |
| | | | 438/57 |
| 2015/0024142 | A1 * | 1/2015 | Nagata .................... C23C 16/50 |
| | | | 427/535 |
| 2015/0024609 | A1 * | 1/2015 | Milligan ........... H01L 21/02274 |
| | | | 156/345.35 |

FOREIGN PATENT DOCUMENTS

| | | |
|---|---|---|
| JP | 2001-237216 A | 8/2001 |
| JP | 2002-056526 A | 2/2002 |
| JP | 2003-223710 A | 8/2003 |
| JP | 2004-256837 A | 9/2004 |
| JP | 2005-171329 A | 6/2005 |
| JP | 2007-026506 A | 2/2007 |
| JP | 2009-283107 A | 12/2009 |
| JP | 2011-243254 A | 12/2011 |
| JP | 2014-203473 A | 10/2014 |
| TW | 488091 B | 5/2002 |
| TW | 200905775 A | 2/2009 |

OTHER PUBLICATIONS

Written Opinion (PCT/ISA/237) dated Feb. 24, 2015, by the Japanese Patent Office as the International Searching Authority for International Application No. PCT/JP2014/005862.

International Preliminary Report on Patentability (PCT/IPEA/409) dated Aug. 20, 2015 for International Application No. PCT/JP2014/005862.

Office Action dated May 17, 2016, by the Taiwanese Patent Office in corresponding Taiwanese Patent Application No. 104101178, and English Translation of the Office Action. (9 pages).

* cited by examiner

VACUUM PROCESS APPARATUS AND VACUUM PROCESS METHOD

This application is a continuation of International Patent Application No. PCT/JP2014/005862 filed on Nov. 21, 2014, and claims priority to Japanese Patent Application No. 2014-041685 filed on Mar. 4, 2014, the entire content of both of which is incorporated herein by reference.

TECHNICAL FIELD

The present invention relates to a vacuum process apparatus suitable for processing a surface protective layer and a vacuum process method for a surface protective layer and, more particularly, to a vacuum process method for the surface protective layer of a magnetic recording medium and a vacuum process apparatus suitable for processing a surface protective layer.

BACKGROUND ART

A surface protective layer for protecting a magnetic recording layer is formed on the surface layer of the magnetic recording medium of a hard disk drive. DLC (Diamond-Like Carbon) is suitable for a surface protective layer, and a protective layer formed by a sputtering method or CVD method (Chemical Vapor Deposition method) is used. Reducing the magnetic spacing between a magnetic recording layer and a magnetic head can increase a recording density. It is therefore necessary to thin a surface protective layer. For this reason, demands have arisen for a protective film which can satisfy a durability requirement even if the film is an ultrathin film. Studies have been made to use, as a surface protective layer, a ta-C (tetrahedral amorphous carbon) film having high durability and high corrosion resistance. A ta-C film is deposited by a physical vapor deposition method using carbon ions. For example, a vacuum arc deposition apparatus like that disclosed in PTL 1 is used.

It is known that a layer having a low $sp^3$ bonding ratio and a low hardness is generated on the uppermost surface of a ta-C film formed by a vacuum arc deposition apparatus. Thinning the surface protective layer will increase the ratio of the thickness of the layer having a low hardness to the total thickness of the film, leading to a deterioration in the innate property of the ta-C film. In order to further thin the surface protective layer, it is preferable to remove the layer having a low $sp^3$ bonding ratio on the surface. For example, PTL 2 discloses a technique of removing a surface layer by using an ion beam in order to thin a protective layer.

CITATION LIST

Patent Literature

PTL 1: U.S. Pat. No. 6,031,239
PTL 2: Japanese Patent Laid-Open No. 2007-26506

SUMMARY OF INVENTION

Technical Problem

In a manufacturing process for a magnetic recording medium, after a surface protective layer is formed, the layer is coated with a fluorocarbon-based liquid lubricant. According to the technique disclosed in PTL 1, however, a dangling bond existing on a substrate surface after a process will make it difficult to unify surface energy. For this reason, the uniformity of the state of the surface after it is coated with a lubricant is not sufficient. When it comes to increase the recording density of a hard disk drive, it is preferable to planarize the surface. If, however, the surface is etched by using argon ions, the surface roughness of the substrate tends to increase.

It is an object of the present invention to provide a surface treatment method of optimizing the uppermost layer of a ta-C film formed by a vacuum arc deposition apparatus and a vacuum process apparatus suitable for such a surface treatment. It is another object of the present invention to provide a surface treatment method which can planarize the surface of a substrate after a process and a vacuum process apparatus suitable for such a surface treatment.

Solution to Problem

A vacuum process apparatus according to the present invention is characterized by comprising a ta-C film forming apparatus configured to form a surface protective layer made of a ta-C film on a substrate, a radical process apparatus configured to perform a radical process of causing radicals to react with the surface protective layer, and a transportation apparatus configured to transport the substrate from the ta-C film forming apparatus to the radical process apparatus without exposing the substrate to atmosphere.

A vacuum process method according to the present invention is a vacuum process method for a magnetic recording medium having a surface protective layer for protecting a magnetic recording layer formed on a substrate, characterized by comprising a ta-C film forming step of forming a ta-C film on the magnetic recording layer, a transport step of transporting a substrate on which the ta-C film is formed, a radical generation step of generating radicals by exciting a process gas, and a radical process step of irradiating a surface of the ta-C film with the radicals.

Advantageous Effects of Invention

The surface treatment method of the present invention can remove a layer having a low $sp^3$ bonding ratio without degrading the innate property of a surface protective layer. In addition, this method can make a surface after a surface treatment have desired chemical properties. Alternatively, the surface treatment method according to the present invention can provide a new function to a surface. The surface treatment method according to the present invention performs chemical etching by using radicals, and hence can prevent an increase in surface roughness caused by the removal of a surface layer. When executing the method of the present invention, it is not always necessary to rotate a substrate stage. For this reason, this method can use an inexpensive apparatus. When executing the method of the present invention in an inline manufacturing apparatus, it is possible to reduce cross contamination caused by the flow of a gas from a radical process apparatus into a ta-C chamber at the time of the transport of a substrate.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

The preferred embodiments will be described in detail below with reference to the accompanying drawings. Note that the constituent elements described in the embodiments are merely examples. The technical scope of the present invention is determined by the scope of claims and is not limited by the following individual embodiments. The following is an embodiment in which a deposition apparatus of the present invention is applied to a deposition apparatus which forms a protective layer on a substrate as a processing target object by using vacuum arc deposition.

First Embodiment

Figure 1:
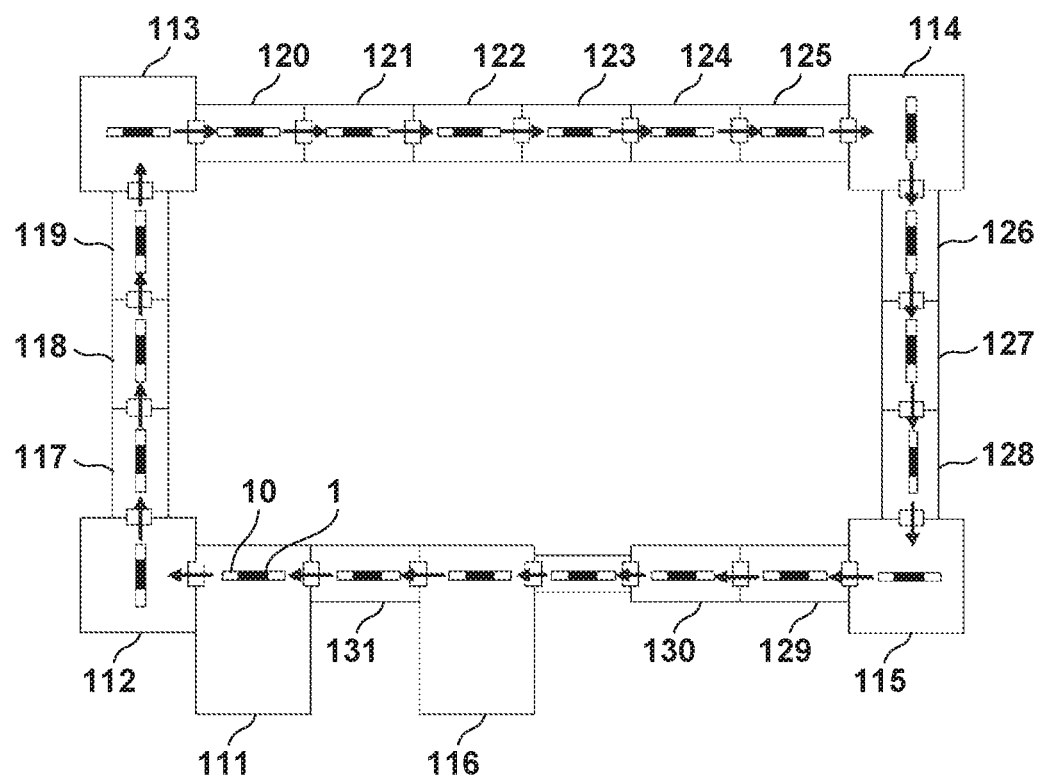
FIG. 1 is a plan view of a vacuum process apparatus according to the first embodiment of the present invention.

A vacuum process apparatus used in the present invention will be described first with reference to FIGS. 1 to 4. FIG. 1 is a plan view showing the vacuum process apparatus according to this embodiment. The vacuum process apparatus according to the embodiment is an inline type deposition apparatus. The vacuum process apparatus according to the embodiment includes a plurality of chambers 111 to 131 connected to each other in an endless rectangular form. Each of the chambers 111 to 131 is a vacuum chamber which is evacuated by a dedicated or shared exhaust system. Each chamber is integrated with a transportation apparatus which transports a carrier 10 between adjacent chambers while substrates are mounted on the carrier 10.

The chambers 111 to 131 are endlessly connected to each other through gate valves. Each of the chambers 111 to 131 is provided with a transportation apparatus which can transport the carrier 10 through the gate valve. Each transportation apparatus has a transportation path which transports the carrier 10 in a vertical posture. Substrates 1 are mounted on the carrier 10 and transported along a transportation path (not shown). The chamber 111 is a load lock chamber which mounts the substrates 1 onto the carrier 10. The chamber 116 is an unload lock chamber which recovers the substrates 1 from the carrier 10. Note that each substrate 1 is a disk-like member made of a metal or glass and having an opening (inner circumferential hole portion) in the central portion of the substrate 1, and is suitable for use as a magnetic recording medium.

A procedure for processing a substrate in the deposition apparatus will be described. First of all, two unprocessed substrates 1 are mounted on the carrier 10 in the load lock chamber 111. The carrier 10 moves into the adhesive layer formation chamber 117 to form an adhesive layer on each substrate 1. When the first carrier 10 is arranged in the adhesive layer formation chamber 117, the two unprocessed substrates 1 are mounted onto the next carrier 10. Subsequently, the next carrier 10 moves into the adhesive layer formation chamber 117, and an adhesive layer is formed on the substrate 1, and the substrates 1 are mounted onto the next carrier 10 in the load lock chamber 111. Every time one tact time elapses, each carrier 10 moves across a corresponding one of the chambers 117 to 131, and a predetermined process is sequentially performed.

The chambers 117 to 131 are process chambers for the execution of various types of processes. Concrete examples of the process chambers include the adhesive layer formation chamber 117 for the formation of an adhesive layer on the substrate 1, the soft magnetic layer formation chambers 118, 119, and 120 for the formation of a soft magnetic layer on the substrate 1 on which the adhesive layer is formed, the seed layer formation chamber 121 for the formation of a seed layer on the substrate 1 on which the soft magnetic layer is formed, the intermediate layer formation chambers 123 and 124 for the formation of an intermediate layer on the substrate 1 on which the seed layer is formed, the magnetic film formation chambers 126, 127, and 128 for the formation of a magnetic film on the substrate 1 on which the intermediate layer is formed, the ta-C film formation chamber 129 for the formation of a surface protective layer formed from a ta-C film on the magnetic film, and the radical process chamber 130 (radical process apparatus) for a radical process with respect to the surface of the ta-C film. The chambers 112, 113, 114, and 115 located at the four corner portions of the vacuum process apparatus having the chambers connected in a rectangular closed loop are direction changing chambers each including a direction changing apparatus which changes the transport direction of the substrate 1 by 90°. The chamber 131 is an ashing chamber which removes deposits adhering to the carrier. The remaining process chambers which have not been described above can be formed as a substrate cooling chamber for cooling the substrate 1, a substrate rotation chamber for transferring the substrate 1.

Figure 2:
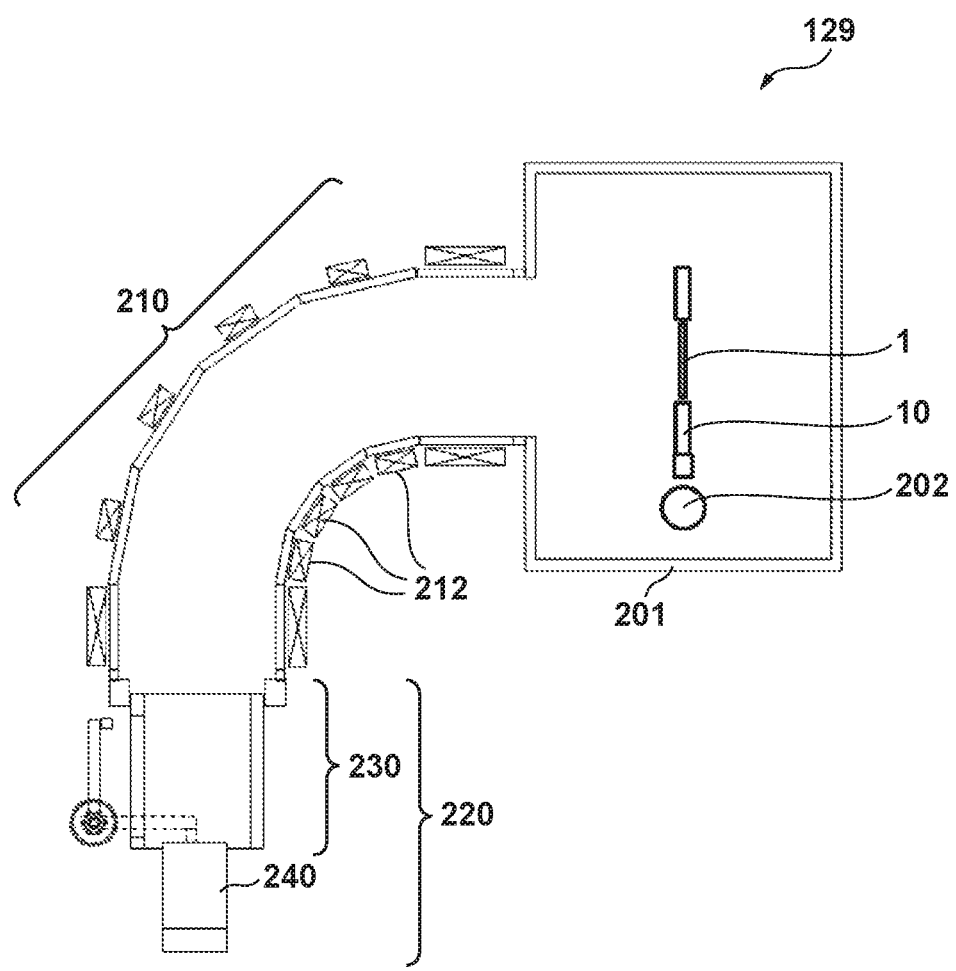
FIG. 2 is a schematic view of a ta-C film deposition chamber according to the first embodiment of the present invention.

FIG. 2 is a schematic view of the ta-C film formation chamber 129. The ta-C film formation chamber 129 according to this embodiment will be described with reference to FIG. 2. The ta-C film formation chamber 129 includes a process chamber 201, a filter unit 210 connected to the process chamber 201 such that the interior of the filter unit communicates with it, and a source unit 220 connected to the filter unit 210 so as to communicate with its interior. The process chamber 201 is internally provided with a transportation apparatus 202 which can move the carrier 10, on which the substrates 1 are mounted, to a predetermined position.

The filter unit 210 is a passage for the transportation of electrons and carbon ions to each substrate 1, and is provided with magnetic field forming means such as filter coils 212 and permanent magnets such that they surround the filter unit 210. The magnetic field forming means form a magnetic field for the transportation of electrons and ions. Although the magnetic field forming means according to this embodiment are provided outside the filter unit 210 (on the atmospheric side), they can be arranged inside of the filter unit 210 (on the vacuum side).

The source unit 220 includes a cathode target unit 240 for generating electrons and carbon ions and an anode unit 230 having an anode electrode. An arc discharge is maintained by maintaining an electron current or ion current between the anode unit 230 and the cathode target unit 240. A carbon target is mounted on the cathode target unit 240 according to this embodiment. In addition, although a ta-C film is formed by the apparatus using a vacuum arc discharge in this embodiment, a ta-C film may be formed by a sputtering process.

Figure 3:
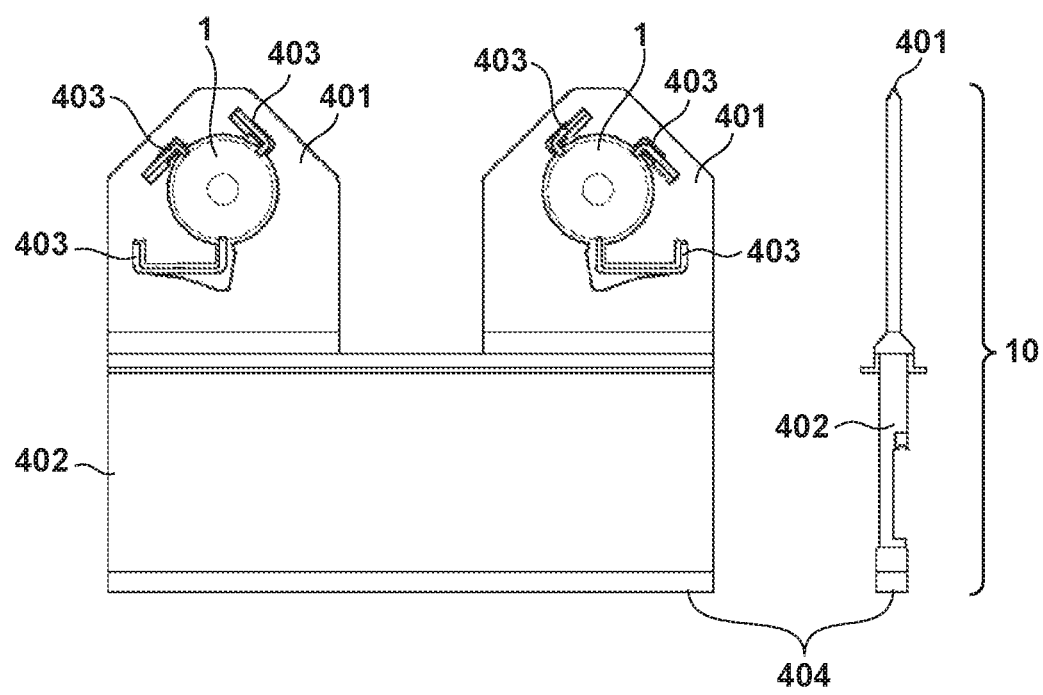
FIG. 3 is a schematic view of a transport carrier according to the first embodiment of the present invention.

FIG. 3 schematically shows the carrier. Two substrates 1 can be simultaneously mounted on the carrier 10. The carrier 10 includes two metal holders 401 which hold the substrates 1 and a slider 402 which holds the holders 401 and moves them on a transportation path. Since several portions of the outer circumferential portion of the substrate 1 can be supported by a plurality of elastic members (leaf springs) 403 provided on each holder 401, the substrate 1 can be held in a posture facing a target without obstructing deposition surfaces on the obverse and reverse surfaces of the substrate 1.

Each transportation apparatus includes many driven rollers arranged along the transportation path and a magnetic screw which guides motive power to the vacuum side by a magnetic coupling scheme. The slider 402 of the carrier 10 is provided with a permanent magnet 404. The slider 402 (carrier 10) can be moved along the driven rollers by rotating the magnetic screw while a spiral magnetic field generated by the rotating magnetic screw is magnetically coupled to the permanent magnet 404 of the slider 402. Note that the arrangements disclosed in Japanese Patent Laid-Open No. 8-274142 can be adopted as the arrangements of the carrier 10 and the transportation apparatus. Obviously, it is possible to use a transportation apparatus using a linear motor and a rack and pinion.

A chamber such as the radical process chamber 130 includes a voltage application means for changing the potential of each substrate 1. The substrate 1 held on the holder of the carrier 10 is electrically connected to the holder 401 via the conductive elastic member (plate spring) 403. Changing the potential of the elastic member 403 can change the potential of the substrate 1. The voltage application means is an apparatus which brings an electrode connected to the bias voltage source 302 or ground into contact with the holder 401. The holder 401 may be set at the ground potential. In addition, various types of power may be applied to the holder 401 by using power supply voltages selected from a DC power supply, a pulse power supply, a high-frequency power supply, and the like, as needed.

Figure 4:
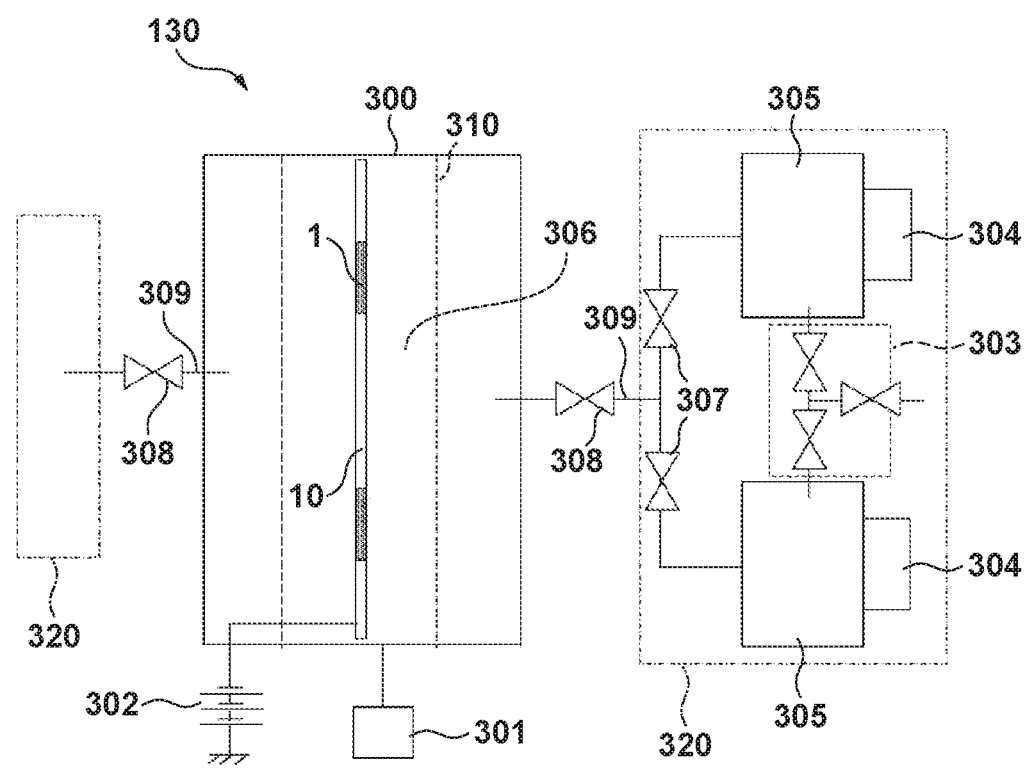
FIG. 4 is a top view of a surface treatment apparatus according to the first embodiment of the present invention.

FIG. 4 is a schematic view when the radical process apparatus 130 (surface treatment apparatus) is seen from the above. The radical process apparatus 130 according to this embodiment will be described with reference to FIG. 4. The radical process apparatus 130 includes a substrate process chamber 300 (radical process chamber), a radical source 320, and a radical introduction path 309 (radical introduction unit) which connects the substrate process chamber 300 to the radical source 320, which is located between the substrate process chamber 300 and the radical source 320. The radical introduction path 309 has a flow rate adjusting unit 308 which adjusts the flow rate of radicals to the substrate process chamber 300. The substrate process chamber 300 has a symmetrical arrangement with respect to the carrier 10 (substrate 1) and is provided with the radical sources 320 and the radical introduction paths 309 which are respectively arranged on the left and right sides. This makes it possible to simultaneously process the two surfaces of each of the two substrates 1 held on the carrier 10. The transportation apparatus is provided to hold the substrate 1 at a predetermined position in the middle through the carrier 10. An exhaust system 301 is a vacuum pump such as a turbo-molecular pump which can evacuate the substrate process chamber 300 to a vacuum.

Each radical source 320 includes a gas introduction unit 303 which introduces a process gas, a radical generation means 304 which generates radicals, a radical generation unit 305 which generates radicals by supplying power to the radical generation means 304, and a valve 307 which controls the radical generation unit 305 and the inflow of radicals from the radical generation unit 305 to the radical introduction path 309. Generated radicals are introduced into the substrate process chamber 300 through the radical introduction path 309.

The gas introduction unit 303 includes a gas supply source such as a compressed gas cylinder, an MFC (Mass Flow Controller) which controls the introduction amount of gas from the gas supply source, a gas introduction member which introduces a gas into the vacuum chamber, and a gas pipe for the circulation of a gas between these members. The radical generation means 304 is a means for generating radicals. The radical generation unit 305 includes the radical generation means 304 and generates radicals by supplying power to an introduced process gas. The radical generation unit 305 is connected to the substrate process chamber 300 through the radical introduction path 309 to make it possible to introduce radicals into the substrate process chamber 300 through the radical introduction path 309. The radical introduction path 309 is provided with the flow rate adjusting unit 308 constituted by an MFC which adjusts the flow rate of a gas, an orifice, and the like.

A gas rectification plate 310 is a pair of plate-like members provided parallel to the substrates 1 arranged at predetermined positions in the substrate process chamber 300, and has many gas nozzles for uniformly irradiating the deposition surfaces of the substrates 1 with radicals. Although this embodiment uses the gas rectification plate 310 provided with gas nozzles arranged at equal intervals or formed in surfaces facing the inner holes of substrates, the gas rectification plate 310 may have gas nozzles annularly arranged at equal intervals. In addition, the number of plate-like members of the gas rectification plate 310 is not limited to two and may be one or three or more. A substrate processing unit 306 is a space between the gas rectification plate 310 and the substrates 1 in the substrate process chamber 300. In the substrate processing unit 306, the surface layers of ta-C films formed on the surfaces of the substrates 1 are processed (radical process) by radicals introduced through the gas rectification plate 310.

The radical generation means 304 is a means for generating a radicals by using ultraviolet light excitation or plasma excitation. As an ultraviolet light excitation source, for example, an excimer lamp or xenon lamp is used. When using plasma excitation, it is possible to use any plasma source, including a high-frequency plasma source and a DC plasma source. The radical generation means 304 may be formed by using both ultraviolet light excitation and plasma excitation.

The radical process chamber 130 includes a plurality of radical generation units 305. The plurality of radical generation units 305 may simultaneously supply radicals or may alternately supply radicals. When alternately supplying radicals, the radical generation unit 305 which has not been used for an immediately preceding process preferably supplies radicals to the substrate process chamber in the next substrate process after one tact time has elapsed. This makes it possible to stably supply radicals, and hence to improve productivity.

A surface treatment process using the radical process apparatus 130 will be described in detail. A process gas is introduced into the radical generation unit 305 of the radical process apparatus 130 at a predetermined flow rate through the gas introduction unit 303. As a process gas, an oxygen gas ($O_2$ gas), a hydrogen gas ($H_2$ gas), or a gas mixture containing them can be used. Alternatively, as a process gas, nitrogen, a gas mixture mixed with at least one of NO, $N_2O$, and $NH_3$, $CF_4$, $C_2F_6$, $C_3F_8$, or the like can be used. Desired power is injected to the radical generation means 304 to dissociate and excite the process gas introduced into the radical generation unit 305, thereby generating radicals in the radical generation unit 305.

The generated radicals are introduced into the substrate processing unit 306 in which the substrates 1 are arranged, together with the introduced gas, through the radical introduction path 309. During this introduction, the flow rate adjusting unit 308 provided in the radical introduction path 309 adjusts the radicals to a desired flow rate. The radicals adjusted to the predetermined flow rate are introduced into the substrate process chamber 300. Each substrate 1 transported to a predetermined position in the substrate processing unit 306 is irradiated with the radicals, which then react with the surface layer of a ta-C film, thereby performing a radical process. The substrates having undergone the radical process are unloaded from the radical process apparatus 130.

Note that in the inline type vacuum process apparatus (see FIG. 1) as in this embodiment, if there is a pressure difference between adjacent process chambers at the time of the transport of each substrate 1, when the gate valve is opened, a gas flows from a high-pressure chamber to a low-pressure chamber. Since a ta-C film formation process according to the present invention uses no process gas, the internal pressure of the ta-C film formation chamber 129 is lower than that of an adjacent chamber. This may cause a gas to flow from the adjacent chamber into the ta-C film formation chamber 129. If a ta-C film formation process is performed while the gas from the adjacent chamber remains in the ta-C film formation chamber 129, a gas component mixes in the film, resulting in a failure to obtain a desired film quality. For this reason, it is preferable to transport the carrier after a process gas in the process chamber adjacent to the ta-C film formation chamber 129 is sufficiently exhausted. Alternatively, it is preferable to form a ta-C film after a gas flowing into the ta-C film formation chamber 129 is sufficiently exhausted.

In the radical process apparatus 130, the radical generation unit 305 is separated from the substrate processing unit 306, and hence it is possible to suppress an unnecessary increase in the internal pressure of the substrate processing unit 306. This is because, since the radical generation unit 305 is separated from the substrate processing unit 306, a gas (radicals) whose flow rate is adjusted to a predetermined flow rate is introduced into the substrate process chamber 300 to result in a reduction in the introduction amount of gas. Using such a structure can further reduce the inflow of a process gas from the radical process apparatus 130 to the ta-C film formation chamber 129 at the time of the transport of the substrate 1.

Second Embodiment

The first embodiment has exemplified the arrangement in which the radical process apparatus 130 performs a radical process. However, a radical process may be performed in an unload chamber. The second embodiment will exemplify an arrangement configured to perform a radical process in an unload chamber. This embodiment is configured to perform a radical process, which is performed by the radical process apparatus 130 according to the first embodiment, in an unload chamber 516. As compared with the vacuum process apparatus in FIG. 1, a vacuum process apparatus according to this embodiment includes the unload chamber 516 which can perform a surface treatment in place of the unload chamber 116 according to the first embodiment, and does not include the radical process apparatus 130 or is configured to perform a different process at the position of the radical process apparatus 130. That is, an unload chamber 516a according to this embodiment corresponds to the radical process chamber 300 according to the first embodiment. The same reference numerals as in the first embodiment denote the same components in the second embodiment, and a detailed description of them will be omitted.

Although the radical process apparatus according to this embodiment is integrally formed with the unload chamber 516, this arrangement includes not only an arrangement in which the unload chamber 516 incorporates the radical process apparatus but also an arrangement in which the unload chamber is adjacent to the radical process apparatus. For example, an arrangement having the radical process apparatus mounted on the substrate unload side of an unload chamber is equivalent to the unload chamber 516, and the same effects as those of this embodiment can be expected.

Figure 5:
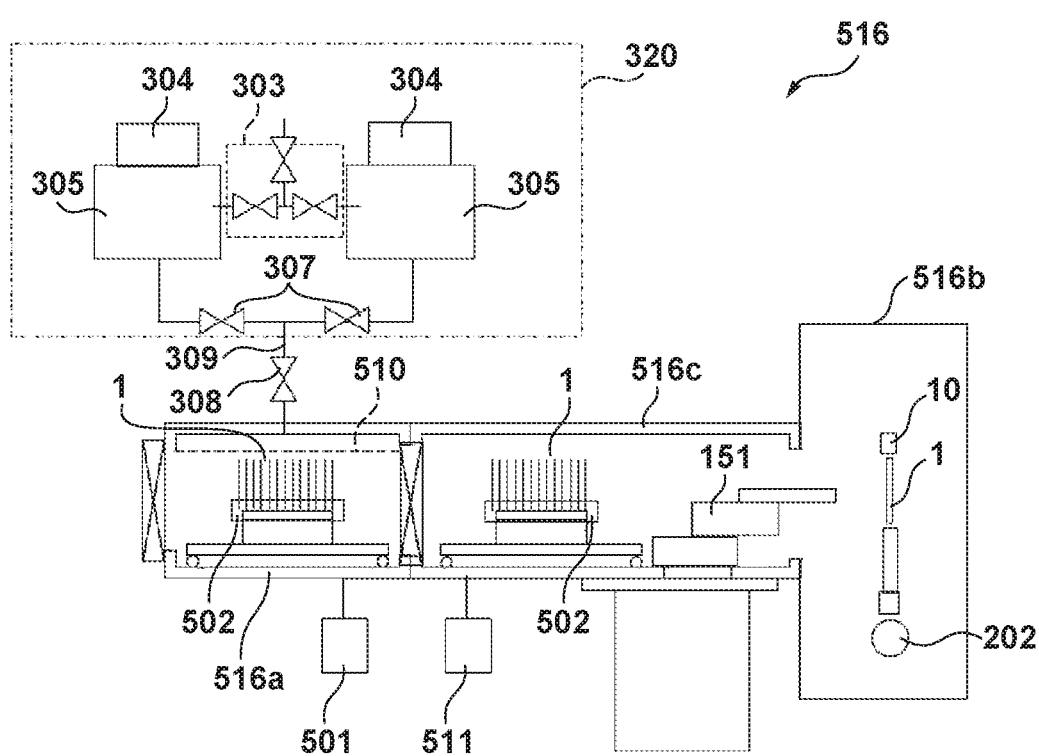
FIG. 5 is a side view of an unload chamber according to the second embodiment of the present invention.

FIG. 5 is a side view of the unload chamber 516 according to this embodiment. The unload chamber 516 is constituted by an unload chamber 516b for the removal of a substrate 1 from a carrier 10, an unload chamber 516c for accommodating the removed substrate, and the unload chamber 516a for unloading the substrate 1 to the atmospheric side upon execution of a surface treatment with respect to the substrate 1. The unload chamber 516a is connected to the unload chamber 516c through a gate valve. Exhaust apparatuses 501 and 511 are respectively connected to the unload chamber 516a and the unload chamber 516c. Each of the unload chambers 516a and 516c includes a cassette 502 (substrate accommodation member) which can accommodate a plurality of substrates 1. The exhaust apparatuses 501 and 511 include vacuum pumps such as turbo-molecular pumps.

The unload chamber 516a is connected to a radical source 320 through a flow rate adjusting unit 308. The radical source 320 includes a gas introduction unit 303 which introduces a process gas, a radical generation means 304 which generates radicals, a radical generation unit 305 which generates radicals by supplying power to the radical generation means 304, a substrate processing unit 306 for performing a radical process with respect to the substrate 1 transported to a predetermined position, a radical introduction path (radical introduction unit) for the introduction of radicals generated from the radical generation unit 305 into the substrate processing unit 306, and a valve 307 which controls the inflow of radicals from the radical generation unit 305 to the radical introduction path. In addition, a flow rate adjusting unit 308 is a member for adjusting the flow rate of radicals introduced from the radical source 320 into the unload chamber 516a. That is, a combination of the unload chamber 516a, the flow rate adjusting unit 308, and the radical source 320 according to this embodiment corresponds to the radical process apparatus 130 according to the first embodiment.

The gas introduction unit 303 includes a gas supply source such as a compressed gas cylinder, an MFC which controls the introduction amount of gas from the gas supply source, a gas introduction member which introduces a gas into the vacuum chamber, and a gas pipe for the circulation of a gas between these members. Like the gas rectification plate 310, a gas rectification plate 510 is a plate-like member provided above the substrate 1 accommodated in the cassette 502 in the unload chamber 516a, and has many gas nozzles for uniformly introducing a gas (radicals). Although this embodiment is provided with only one gas rectification plate 510, the embodiment may be provided with a plurality of gas rectification plates 510.

Introducing radicals through the radical introduction path 309 and the gas rectification plate 510 can simultaneously perform radical processes with respect to a predetermined number of substrates 1 accommodated in the cassette 502. The vacuum process apparatus according to this embodiment can simultaneously perform radical processes with respect to many substrates 1, and hence can greatly improve throughput.

Third Embodiment

Figure 6:
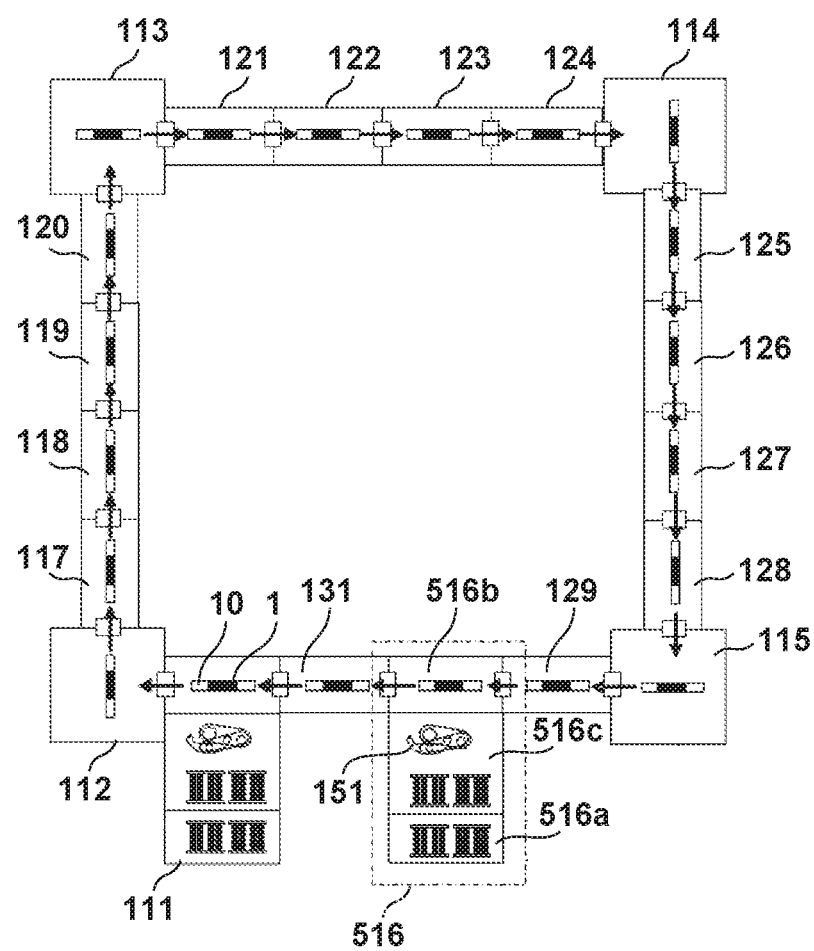
FIG. 6 is a plan view of a vacuum process apparatus according to the third embodiment of the present invention.

FIG. 6 is a plan view showing a vacuum process apparatus according to the third embodiment of the present invention. The vacuum process apparatus according to this embodiment differs from the vacuum process apparatus according to the second embodiment in that a ta-C film formation chamber 129 is arranged between a direction changing chamber 115 and an unload chamber 516b. As in the second embodiment, an unload chamber 516a performs a radical process. The same reference numerals as in the first embodiment denote the same components in the third embodiment, and a detailed description of them will be omitted.

A case in which the vacuum process apparatus according to this embodiment performs a radical process will be described. First of all, a substrate 1 on which a ta-C film is formed in the ta-C film formation chamber 129 is transported into the unload chamber 516b, in which the substrate 1 is removed from a carrier 10 and accommodated in a cassette 502. Thereafter, when a plurality of substrates are accommodated in the cassette 502, a substrate transfer robot 151 transports the substrate from the unload chamber 516b to the unload chamber 516a. Radical processes using radicals are performed with respect the two surfaces of the substrate 1 by using the unload chamber shown in FIG. 5.

The vacuum process apparatus according to this embodiment is configured to arrange the ta-C film formation chamber 129 between the direction changing chamber 115 and the unload chamber 516b as a radical process apparatus and perform a surface treatment (radical process) by using the unload chamber 516a. For this reason, no chambers using a process gas are arranged on the two sides of the ta-C film formation chamber 129. With this arrangement, in an inline type manufacturing apparatus, it is possible to reliably prevent the inflow of a process gas from an adjacent chamber into the ta-C film formation chamber 129 at the time of the transport of the substrate 1. This makes it possible to continuously form ta-C films with high film quality at high productivity.

Examples of a surface treatment using the above vacuum process apparatus will be described below as Examples 1 and 2. An adhesive layer, a lower soft magnetic layer, a seed layer, an intermediate layer, a magnetic recording layer, and a ta-C film as a surface protective layer were sequentially stacked on a substrate by using the apparatus described in the first embodiment. The substrate was then transported to a radical process apparatus 130, and surface treatments using radicals were executed with respect to the two surfaces of the substrate on which the ta-C films were formed. Note that when using the vacuum process apparatus according to the second or third embodiment, the same processing as that described above is performed except that an unload chamber 516a performs a radical process.

Example 1

Figure 7:
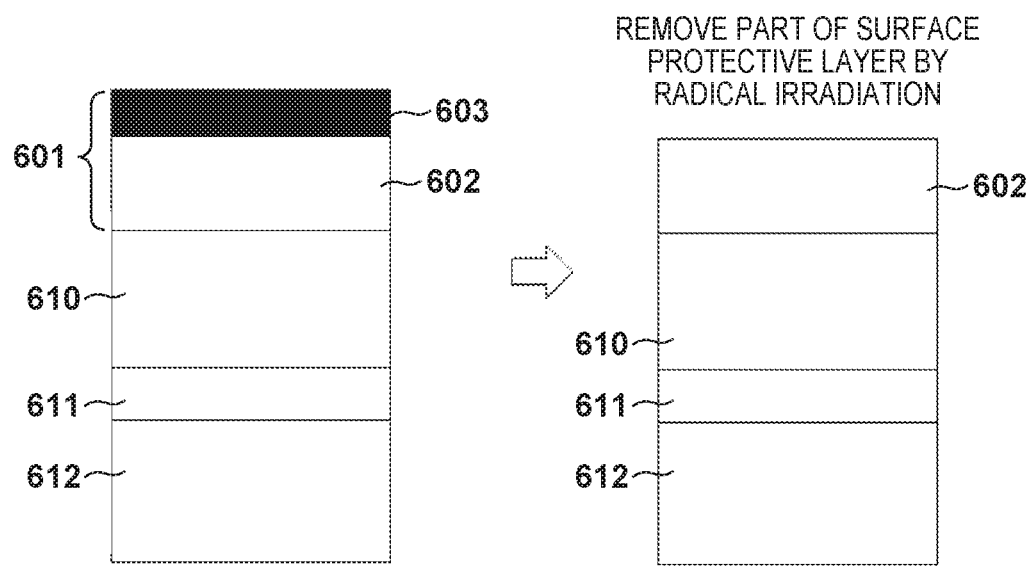
FIG. 7 is a sectional view of a film manufactured by a surface treatment method according to the first embodiment of the present invention.

FIG. 7 shows a surface treatment method according to Example 1. A layer 603 with a low $sp^3$ bonding ratio is formed on the surface of a ta-C film 601, on which a magnetic layer 610 is formed, to a depth of about 0.5 nm. As shown in FIG. 7, after the surface protective layer 601 is partially removed by radicals, the layer 603 with a low $sp^3$ bonding ratio is removed without an increase in surface roughness. As a consequence, a layer 602 with a high $sp^3$ bonding ratio remains. This increases the $sp^3$ bonding ratio of the whole film. A layer 611 between a substrate cross-section 612 and the magnetic layer 610 is a multilayer member constituted by an adhesive layer, a soft magnetic layer, a seed layer, and an intermediate layer. As a material for the adhesive layer, AIti, AITa, NiTa, CoTiAI, or the like can be used. As a material for the soft magnetic layer, a multilayer member constituted by an FeCo alloy, FeTa alloy, Co alloy, Ru alloy, and the like can be used. As a material for the seed layer, an NiW alloy, NiFe alloy, NiTa alloy, Tati alloy, or the like can be used. As a material for the intermediate layer, a multilayer member constituted by Ru and an Ru alloy can be used.

When the layer 603 with a low $sp^3$ bonding ratio is removed by radicals, since the uppermost surface layer of the layer 602 with a high $sp^3$ bonding ratio is irradiated with radicals, the surface energy of the uppermost surface layer of the layer 602 with a high $sp^3$ bonding ratio can be uniformly controlled. When performing a surface treatment in this example, since the radical generation unit 305 is connected to the substrate processing unit 306 through the radical introduction path 309, the ta-C film is not directly exposed to a plasma or ultraviolet light. For this reason, the ta-C film is free from damage by ions and ultraviolet light propagating from the plasma and having kinetic energy at the time of a surface treatment. This prevents the ta-C film from degrading in quality and characteristics. As a process gas in this example, an oxygen gas, a hydrogen gas, or a gas mixture containing them can be used.

Example 2

Figure 8:
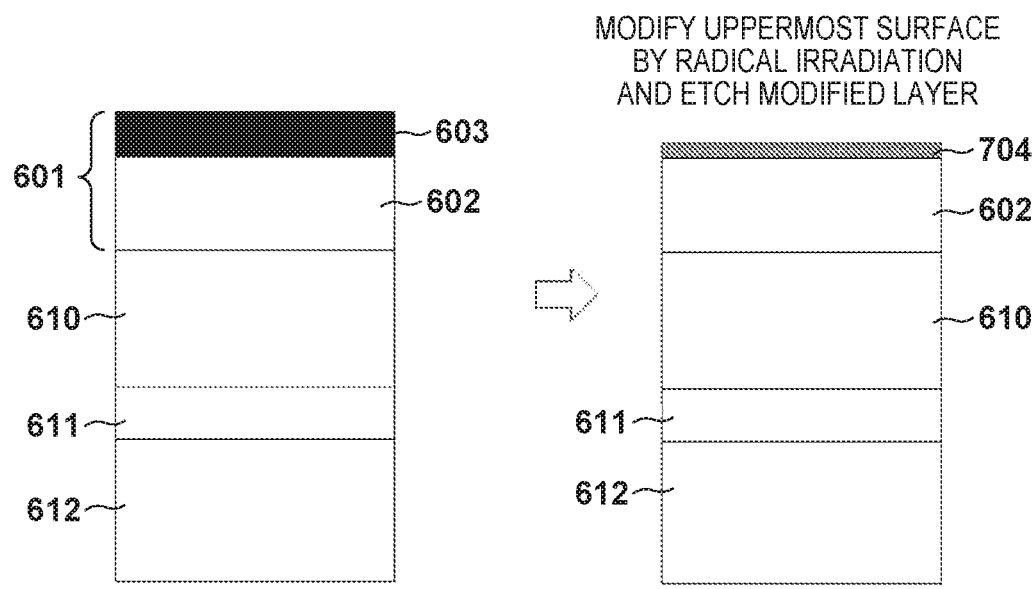
FIG. 8 is a sectional view of a film manufactured by a surface treatment method according to the second embodiment of the present invention.

FIG. 8 shows a surface treatment method according to Example 2. As describe above, a layer 603 with a low $sp^3$ bonding ratio is formed on the surface on which a ta-C film 601 is formed. In this example, a surface-treated layer 704, with the layer 603 with a low $sp^3$ bonding ratio whose quality being improved by radical irradiation, was formed. When performing radical irradiation in this embodiment, since etching is performed while the surface-treated layer 704 is formed, the surface-treated layer 704 thinner than the layer 603 with a low $sp^3$ bonding ratio can be formed. The surface-treated layer 704 is formed by improving the quality of the layer 603 with a low $sp^3$ bonding ratio, and exhibits no increase in surface roughness as compared with the layer 603 with a low $sp^3$ bonding ratio.

In this case, the characteristics and etching rate of the surface-treated layer 704 formed in Example 2 can be controlled by selecting the amount of radicals to be applied, an irradiation time, the mixing ratio of a process gas, and the like. For example, it is possible to obtain the surface-treated layer 704 provided with properties including hydrophily and lubricant affinity being improved by forming a nitrided layer or properties including water repellency and releasability being improved by forming a fluoridated layer. When performing a radical process, a type of gas is selected to generate radicals in accordance with the provided properties, and the gas is supplied to the radical generation unit 305.

When forming a nitrided layer as the surface-treated layer 704, nitrogen or a gas mixture mixed with at least one of NO, $N_2O$, and $NH_3$ is used as a process gas. In this case, the properties and etching rate of the surface-treated layer can be controlled by selecting the amount of radicals to be applied, an irradiation time, the mixing ratio of a process gas, and the like. In particular, it is possible to promote the etching of carbon by adding oxygen or hydrogen gas in addition to the above process gas.

When forming a fluoridated layer as the surface-treated layer 704, $CF_4$, $C_2F_6$, $C_3F_8$, or the like is used as a process gas. In this case, the characteristics and etching rate of the surface-treated layer can be controlled by selecting the amount of radicals to be applied, an irradiation time, and a type of gas. Desired power is supplied to the radical generation means 304 to dissociate and excite the process gas introduced into the radical generation unit 305, thereby causing the radical generation unit 305 to generate radicals. A radical process according to Example 2 can simultaneously perform both improving of the quality of an extreme surface layer (for example, nitriding) and etching. However, depending on a selected type of gas (for example, pure $N_2$), this process can be performed to only improve the quality of an extreme surface.

The present invention is not limited to the above embodiments and various changes and modifications can be made within the spirit and scope of the present invention. Therefore, to apprise the public of the scope of the present invention, the following claims are made.

What is claimed is:

1. A vacuum process apparatus comprising:
    a ta-C film forming apparatus configured to form a surface protective layer made of a ta-C film on a substrate; and
    a transportation apparatus configured to transport the substrate from the ta-C film forming apparatus to an unload chamber without exposing the substrate to atmosphere,
    wherein the vacuum process apparatus including a plurality of chambers, each configured to perform a predetermined process with respect to the substrate, connected to each other in an endless rectangular form,
    the plurality of chambers include a direction changing chamber arranged at a position of a corner of the rectangular form to change a transport direction of the substrate, a load lock chamber configured to supply the substrate to the vacuum process apparatus, the unload chamber configured to unload the substrate from the vacuum process apparatus, a ta-C film formation chamber including the ta-C film forming apparatus, and
    wherein the unload chamber comprises:
    a radical process chamber in which the substrate is arranged, the radical process chamber comprising a cassette configured to hold the substrate in a direction perpendicular to a ground and in a state in which the surface protective layer and an opposing surface protective layer of the substrate are radical processable,
    a radical generator configured to generate radicals from a process gas,
    a radical introduction path configured to introduce the radicals generated by the radical generator into the radical process chamber,
    the radicals are irradiated in a direction parallel to the surface protective layer of the substrate,
    wherein the surface protective layer contains a low $sp^3$ bonding ratio layer and a high $sp^3$ bonding ratio layer formed thereon,
    and
    wherein the radical process is applied to the low $sp^3$ bonding ratio layer in the radical process chamber.

2. The vacuum process apparatus according to claim 1, wherein the cassette is configured to accommodate the plurality of substrates in the radical process chamber.

3. The vacuum process apparatus according to claim 1, wherein the radical process apparatus is capable of processing a plurality of substrates held in a direction perpendicular to the ground.

4. The vacuum process apparatus according to claim 1, wherein the radical process chamber further comprises a gas rectification plate configured to uniformly irradiate the radicals to the surface protective layer and the opposing surface protective layer of the substrate.

* * * * *